United States Patent
Young

(10) Patent No.: US 7,849,436 B2
(45) Date of Patent: Dec. 7, 2010

(54) METHOD OF FORMING DUMMY PATTERN

(75) Inventor: Choi Jae Young, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 650 days.

(21) Appl. No.: 11/889,384

(22) Filed: Aug. 13, 2007

(65) Prior Publication Data

US 2008/0038847 A1 Feb. 14, 2008

(30) Foreign Application Priority Data

Aug. 11, 2006 (KR) .................. 10-2006-0076189

(51) Int. Cl.
*G06F 17/50* (2006.01)

(52) U.S. Cl. .................. 716/19; 716/2; 716/10; 716/11; 716/21

(58) Field of Classification Search .............. 716/2, 716/10, 11, 19, 21
See application file for complete search history.

(56) References Cited

U.S. PATENT DOCUMENTS

| | | | | |
|---|---|---|---|---|
| 5,923,563 | A * | 7/1999 | Lavin et al. ................. | 716/19 |
| 6,225,697 | B1 * | 5/2001 | Iguchi ........................ | 257/758 |
| 7,197,737 | B1 * | 3/2007 | Iandolo et al. .............. | 716/10 |
| 2002/0157076 | A1 * | 10/2002 | Asakawa .................... | 716/10 |
| 2003/0204832 | A1 * | 10/2003 | Matumoto .................. | 716/19 |
| 2004/0083438 | A1 * | 4/2004 | Ohba et al. ................. | 716/2 |
| 2005/0097490 | A1 * | 5/2005 | Travis et al. ............... | 716/10 |
| 2005/0235246 | A1 * | 10/2005 | Smith et al. ................ | 716/21 |
| 2007/0015365 | A1 * | 1/2007 | Chen et al. ................. | 438/692 |
| 2007/0174802 | A1 * | 7/2007 | Shin et al. .................. | 716/8 |
| 2008/0034332 | A1 * | 2/2008 | Anikin et al. .............. | 716/2 |
| 2009/0024978 | A1 * | 1/2009 | Kim ........................... | 716/19 |
| 2010/0077367 | A1 * | 3/2010 | Nitta .......................... | 716/5 |

FOREIGN PATENT DOCUMENTS

KR 1020020068419 8/2002

OTHER PUBLICATIONS

Office Action from Korean Intellectual Property Office dated Aug. 28, 2007 in Korean Application No. 10-2006-0076189.

* cited by examiner

*Primary Examiner*—Vuthe Siek
*Assistant Examiner*—Patrick Sandoval
(74) *Attorney, Agent, or Firm*—Finnegan, Henderson, Farabow, Garrett & Dunner, L.L.P.

(57) ABSTRACT

A method of forming a dummy pattern on a mask for fabricating a semiconductor device is disclosed. The method may include a step of calculating a distance in a device isolation area between a first chip area and a second chip area having different pattern densities. In addition, the method may include comparing the distance and a first reference distance. The method may further include forming the dummy pattern in the device isolation area based on the comparison result. The dummy pattern may have a plurality of partitions. Each of the plurality of partitions may have a pattern density according to a position of the partition. A quantity of the partitions may be based on the comparison result. And at least one partition may have a pattern density which is substantially equal to an average of the pattern densities of the first and the second chip areas.

7 Claims, 5 Drawing Sheets

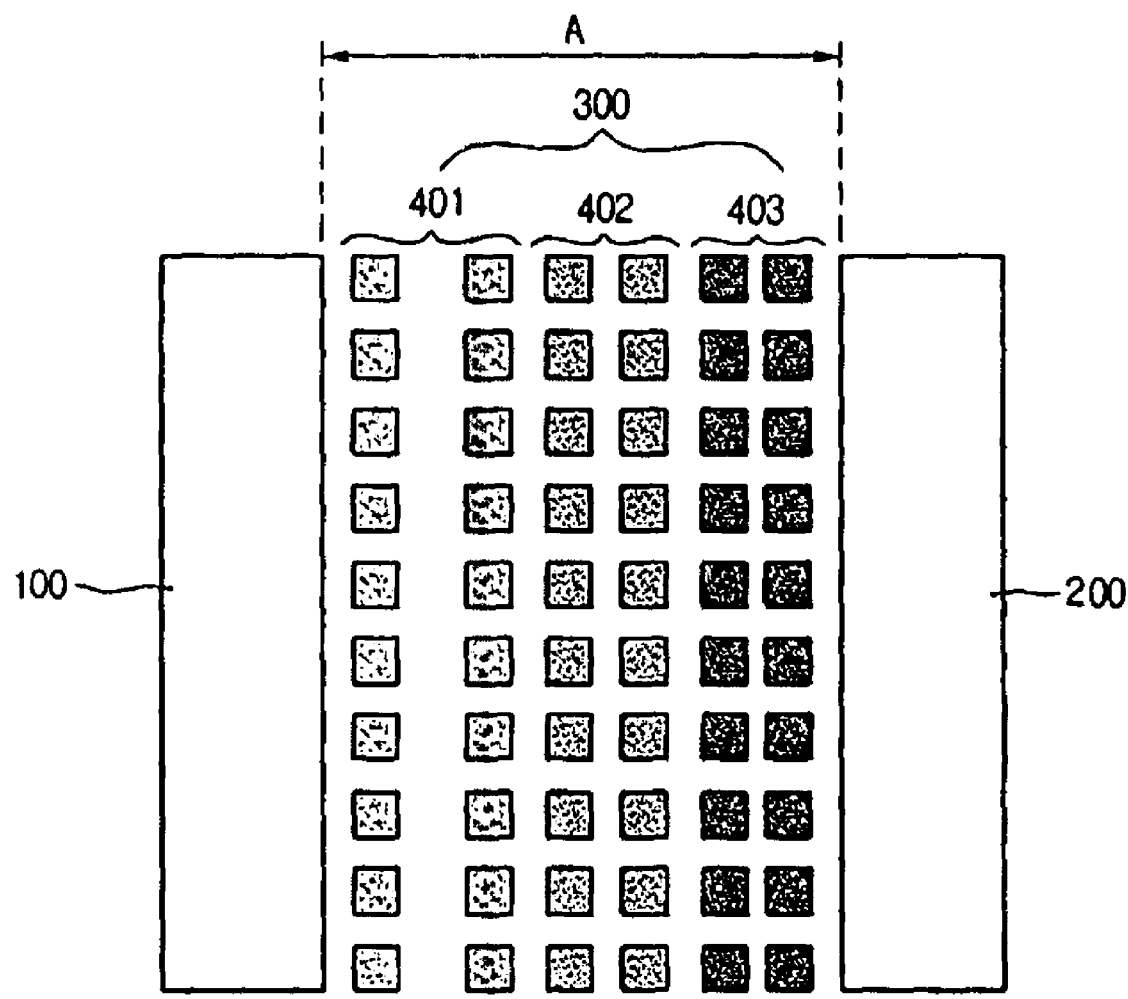

METHOD OF FORMING DUMMY PATTERN

RELATED APPLICATION

The application is based upon and claims the benefit of priority to Korean Patent Application No. 10-2006-0076189, filed on Aug. 11, 2006, the entire contents of which are incorporated herein by reference.

BACKGROUND

1. Technical Field

The embodiment relates to a mask for fabricating a semiconductor device, and more particularly to a method of forming a dummy pattern capable of reducing pattern density variation within a chip in a CMP (chemical mechanical polishing) process.

2. Background

By means of the reduction of a design rule according to high integration of a semiconductor device, for example, in technique below 0.18 μm there is a limitation to apply a LOCOS process thereto due to problems such as birds beak, etc., when forming a device isolating layer.

Therefore, in recent methods, a device isolating layer is formed by applying a shallow trench device isolation (STI) process where the birds beak does not occur.

The STI process generally consists of forming a trench in a device isolation area of a semiconductor substrate using a pad oxide film/a pad nitride film as a mask, burying the oxide film in the trench, and then planarizing it by means of a chemical mechanical polishing (CMP) process.

Such a CMP process sensitively reacts to pattern density so that it is important to maintain the pattern density within a chip to be constant. Therefore, it may be a key point to be designed in consideration of such a pattern density from the beginning of a design stage.

FIG. 1 is process cross-sectional view explaining a method of forming a device isolating layer using a dummy pattern in the related art, and FIG. 2 is a dummy rule used for forming the dummy pattern.

First, referring to FIG. 1, a pad oxide film 14b and a pad nitride film 14a are sequentially deposited on a semiconductor substrate 11. Then, a mask pattern 14 masking a portion of a relatively wide device isolation area is formed on the relatively wide device isolation area, where exposing a device isolation area of the substrate 11 by patterning the pad nitride film 14a and the pad oxide film 14b by means of a photolithography and an etching process.

Thereafter, a trench 16 is formed in the device isolation area by etching the substrate 11 using the mask pattern 14 and at the same time, a dummy pattern 17 is formed inside the trench 16 with a relatively wide width.

Herein, the dummy patter 17 is arranged spaced from the inner wall of the trench 16, and has a rectangular photo frame shape, wherein the both sides thereof have a straight profile.

Thereafter, an oxide film 15 is deposited over the substrate 11 so that the trench 16 is buried, and although not shown, the surface thereof is planarized by removing the oxide film 15 so that the surface of the mask pattern 14 is exposed by means of the CMP process and then the mask pattern 14 is removed so that a device isolating layer formed of the oxide film 15 is formed.

Referring to FIG. 2 for the dummy rule used in the related art, a dummy pattern 40 having the same pattern density is applied between the chip areas 20 and 30 where a plurality of devices are formed.

In other words, the chip areas 20 and 30 where the devices are formed are not formed having the same pattern density therebetween, but are generally formed so that the pattern density of the first chip area 20 is higher than that of the second chip area 30.

Therefore, as shown in the related art, when the dummy pattern 40 having the same pattern density is applied without considering the density difference of the chip areas 20 and 30 where the devices are formed, the variation of the pattern within the chip areas 20 and 30 is not reduced, causing the variation of the thickness of the polished surface in the subsequent CMP process.

SUMMARY

The embodiment provides a method of forming a dummy pattern capable of reducing a pattern density variation within a chip area in a CMP process.

The method of forming a dummy pattern according to the embodiment comprises the step of: for first chip area and second chip area in which devices are formed, forming the dummy pattern formed between a first chip area and a second chip area in a plurality of patterns having various pattern densities.

Also, the method of forming the dummy pattern according to the embodiment comprises the steps of: calculating the distance between a first chip area and a second chip area having different pattern densities; and applying a first dummy pattern rule or a second dummy pattern rule depending on the distance between the first chip area and the second chip area, wherein the first dummy pattern rule or the second dummy pattern rule is formed to have a plurality of dummy patterns having various pattern density.

BRIEF DESCRIPTION OF THE DRAWINGS

The accompanying drawings, which are included to provide a further understanding of the invention and are incorporated in and constitute a part of this application, illustrate embodiments consistent with the invention and together with the description serve to explain the principles of the invention. In the drawings:

FIG. 5 is a view explaining a dummy pattern rule according to one exemplary embodiment.

DETAILED DESCRIPTION OF THE DRAWINGS

Hereinafter, a method of forming a dummy pattern according to the embodiment will be described in detail with reference to the accompanying drawings.

Figure 1:
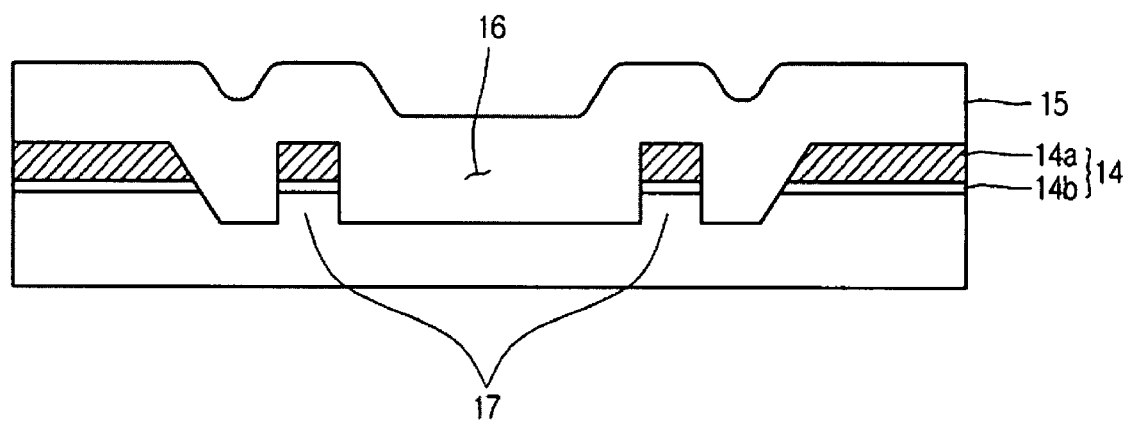
FIG. 1 is a cross-sectional view of a process explaining a method of forming a device isolating layer using a dummy pattern in the related art, according to one exemplary embodiment.
Figure 2:
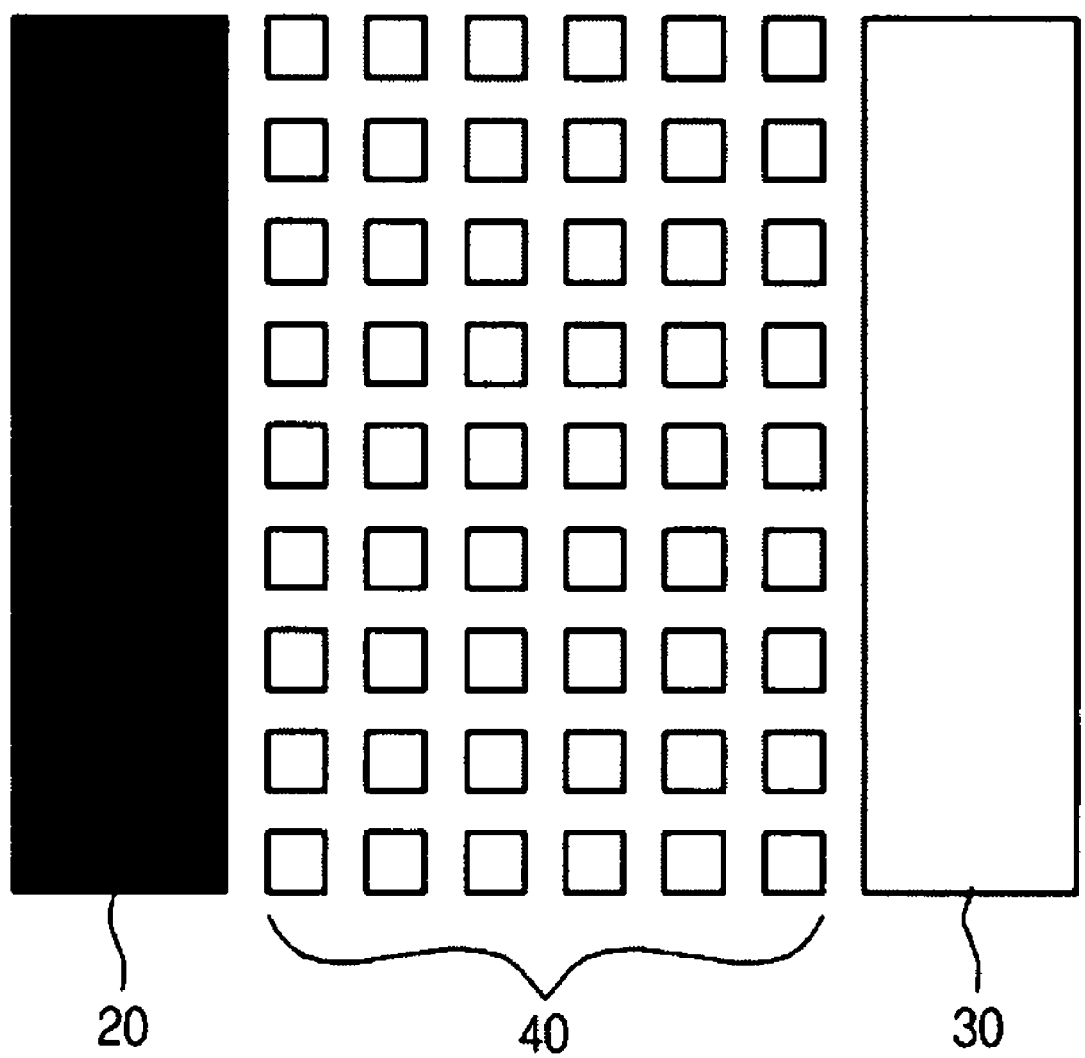
FIG. 2 is a dummy rule used for forming the dummy pattern, according to one exemplary embodiment.
Figure 3:
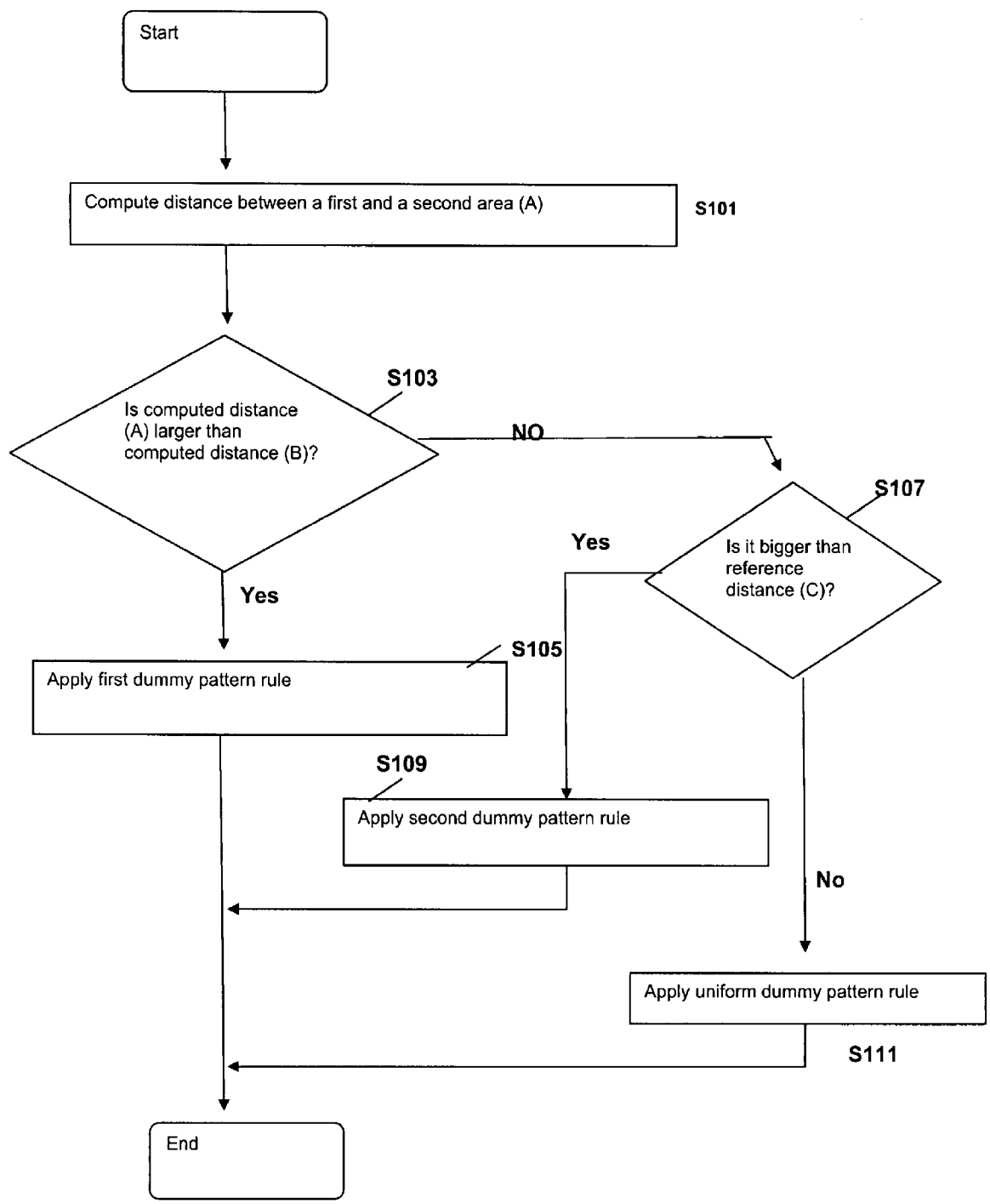
FIG. 3 is a flow chart explaining a method of forming a dummy pattern according to one exemplary embodiment.

FIG. 3 is a flow chart explaining a method of forming a dummy pattern according to one embodiment.

The distance A between chip areas where a plurality of devices are formed is calculated (S101). Herein, the chip areas can be divided into a first chip area having a predetermined pattern density and a second chip area having a relatively lower pattern density as compared to the first chip area.

Then, it is judged whether or not the distance A between the first chip area and the second chip area is larger than a predetermined distance, that is, a first reference distance B (S103), and when the distance A between the chips is larger than the first reference distance B, a first dummy pattern rule is applied according to the embodiment (S105).

If, when the distance A between the chips is not larger than the first reference distance B, it is judged whether or not it is larger than a second reference distance C (S107), wherein the second reference distance C will be the case smaller than the first reference distance B.

When the distance A between the chips is larger than the second reference distance C, that is, when the distance A between the chips is between the second reference distance C and the first reference distance B, a second dummy pattern rule according to a second embodiment is applied (S109).

Then, when the distance A between the chips is smaller than the second reference distance C, a uniform pattern rule having the same pattern density is applied (S11), wherein the uniform pattern rule represents that the dummy pattern between the chip areas are formed at a uniform density.

Hereinafter, the first dummy pattern rule and the second dummy pattern rule applied depending on the distance between the chip area will be described in detail.

Figure 4:
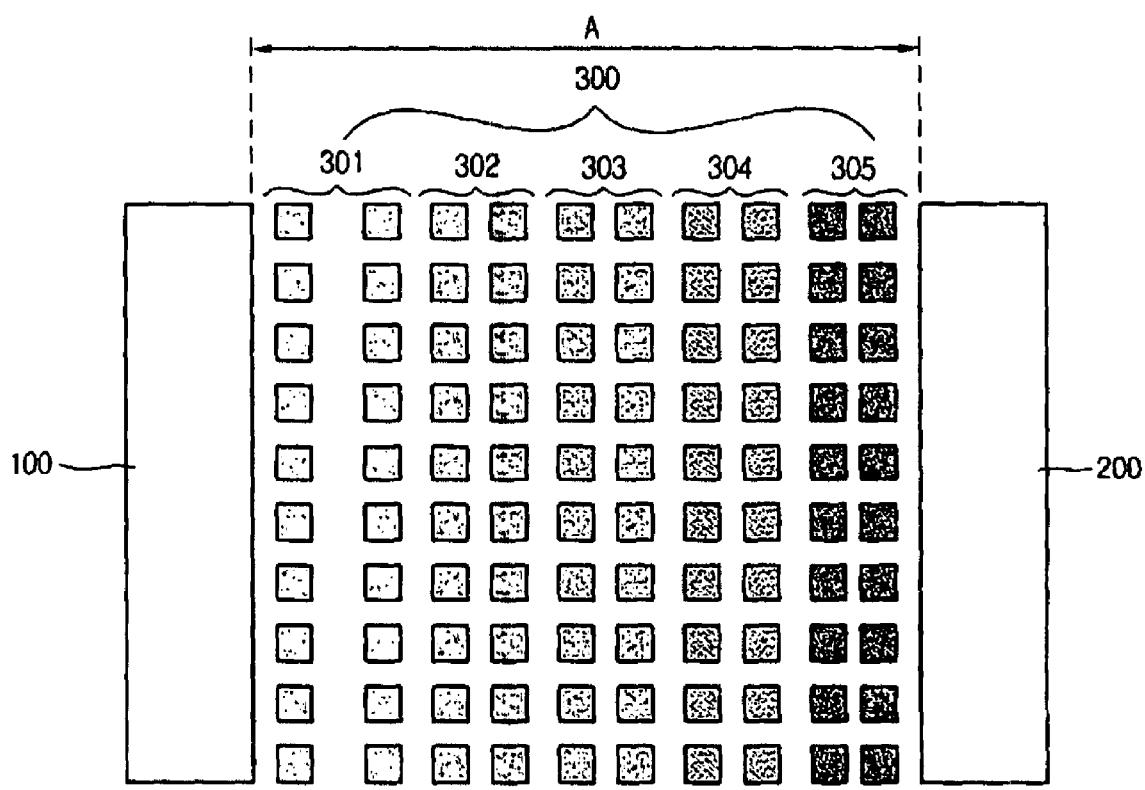
FIG. 4 is a view explaining a dummy pattern rule according to one exemplary embodiment.

FIG. 4 is a dummy rule explaining a dummy pattern rule according to an exemplary embodiment.

Referring to FIG. 4, a first chip area 100 and a second chip area 200, provided with a plurality of devices and having different pattern densities, are formed, and a dummy pattern 300 having various pattern densities is formed between the chip areas 100 and 200.

More specifically, the dummy pattern 300 is provided with a third dummy pattern 303 having the average density of the pattern density of the first chip area 100 and the second chip area 200, first and second dummy patterns 301 and 302 having a lower pattern density than the third dummy pattern 303, and fourth and fifth dummy patterns 304 and 305 having a higher pattern density than the third dummy pattern 303.

In other words, according to the embodiment, when the distance between the first chip area 100 and the second chip area 200 is larger than the first reference distance B, the dummy pattern 300 is formed to have the five partitioned areas as shown, wherein the dummy pattern 300 is formed to have various pattern densities.

First, the third dummy pattern 303 is approximately formed in the center portion of the distance A between the chip areas, wherein the third dummy pattern 303 is formed at the average density of the pattern density between the first chip area 100 and the second chip area 200.

And, the first dummy pattern 301 is formed by about 60% of the pattern density of the third dummy pattern 303, and the second dummy pattern 302 is formed by about 80% of the pattern density of the third dummy pattern 303.

And, the fourth dummy pattern 304 is formed by about 130% of the pattern density of the third dummy pattern 303, and the fifth dummy pattern 305 is formed by about 160% of the pattern density of the third dummy pattern 303.

The method of forming the dummy pattern constituted as above will be described in detail as follows.

After the average pattern density d between the neighboring chip areas is calculated, the dummy pattern is inserted into the first chip area 100 having high density in the area corresponding to ⅕ from the distance between the chip areas 100 and 200 at the density multiplying the average pattern density d by 60%, and the dummy pattern is inserted into the second chip area 200 having relatively smaller density as compared to the first chip area 100 at the density multiplying the average pattern density d by 160%.

And, the dummy pattern is again inserted into the area spaced from ⅕ to ⅖ from the first chip area 100 at the density multiplying the average pattern density d by 80%, and the dummy pattern is inserted into the second chip area 200 at the density multiplying the average pattern density d by 130%, and the dummy pattern is finally inserted into the center area at the average pattern density d.

By means of the formation of such a dummy pattern, dummy patterns having different pattern densities depending on the density of chip area are formed and thus, the thickness variation after being subject to the CMP process is reduced.

FIG. 5 is a dummy rule explaining a dummy pattern rule according to an exemplary embodiment.

Referring to FIG. 5, a first chip area 100 and a second chip area 200 having a plurality of devices formed therein and having different pattern densities are formed, and a dummy pattern 400 formed to have various pattern densities is formed between the chip areas 100 and 200.

More specifically, the dummy pattern 400 is provided with a second dummy pattern 402 having the average density of the pattern density of the first chip area 100 and the second chip area 200, a first dummy pattern 401 having a lower pattern density than the second dummy pattern 402, and a third dummy pattern 403 having a higher pattern density than the second dummy pattern 402.

In other words, according to the embodiment, when the distance A between the first chip area 100 and the second chip area 200 is not larger than the first reference distance B but larger than the second reference distance C, the dummy pattern 400 is formed to have the three partitioned areas as shown, wherein the dummy pattern 400 is formed to have various pattern densities.

First, the second dummy pattern 402 is approximately formed in the center portion of the distance A between the chip areas, wherein the second dummy pattern 402 is formed at the average density of the pattern density between the first chip area 100 and the second chip area 200.

And, the first dummy pattern 401 having relatively lower pattern density than the second dummy pattern 402 is formed in the first chip area 100 having relatively higher pattern density as compared to the second chip area 200, and the third dummy pattern 403 having higher pattern density than the second dummy pattern 402 is formed in the second chip area 200.

The method of forming the dummy pattern constituted as above will be described in detail as follows.

After the average pattern density d between the neighboring chip areas is calculated, the first dummy pattern 401 is inserted into the first chip area 100 having high density in the area corresponding to ⅓ from the distance between the chip areas 100 and 200 at the density multiplying the average pattern density d by 60%, and the third dummy pattern 403 is inserted into the second chip area 200 having relatively smaller density as compared to the first chip area 100 at the density multiplying the average pattern density d by 160%.

And, the second dummy pattern 402 having the average pattern density d of the chip areas 100 and 200 is inserted into between the first dummy pattern 401 and the third dummy pattern 403.

With the embodiment as described above, the dummy patterns formed between the chip areas are designed in consideration of the pattern density provided in the chip area, having an advantage that the thickness variation within the chip areas after being subject to the CMP process is reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a dummy pattern on a mask for fabricating a semiconductor device, the method comprising:
    calculating a separation distance in a device isolation area between first and second chip areas having different pattern densities;
    comparing the separation distance and a first reference distance to determine whether or not the separation distance is larger than the first reference distance;
    forming the dummy pattern in the device isolation area based on the comparison result, wherein:
        the dummy pattern has a plurality of partitions;
        the partitions have pattern densities according to a position of the respective partition;
        a quantity of the partitions is based on the comparison result; and
        at least one partition has a pattern density which is substantially equal to an average of the pattern densities of the first and the second chip areas.

2. The method according to claim 1, wherein the quantity of the partitions is in the range of three to nine.

3. The method according to claim 2, when the separation distance is larger than the first reference distance, forming the dummy pattern into first, second, third, fourth, and fifth partitions, wherein:
    the third partition has a pattern density which is substantially equal to an average of the pattern densities of the first and second chip areas;
    the first partition and the second partition have relatively lower pattern densities than the pattern density of the third partition; and
    the fourth partition and the fifth partition have relatively higher pattern densities than the pattern density of the third partition.

4. The method according to claim 3, wherein:
    the first chip area has a lower pattern density than the second chip area;
    a first group of partitions, including the first and the second partitions, is adjacent to the first chip area;
    a second group of partitions, including the fourth and the fifth partitions, is adjacent to the second chip area; and
    the third partition is positioned between the first group and the second group.

5. The method according to claim 2, wherein:
    when the separation distance is not larger than the first reference distance, judging whether or not the separation distance is larger than a second reference distance, the second reference distance being smaller than the first reference distance,
    when the separation distance is larger than the second reference distance, forming the dummy pattern into first, second, and third partitions, wherein:
        the second partition has a pattern density which is substantially equal to an average of the pattern densities of the first chip area and the second chip area;
        the first partition has a relatively lower pattern density than the pattern density of the second partition; and
        the third partition has a relatively higher pattern density than the pattern density of the second partition.

6. The method according to claim 5, wherein if the separation distance is not larger than the second reference distance, forming the dummy pattern with a uniform pattern density.

7. The method according to claim 5, wherein:
    the first chip area has a lower pattern density than the second chip area;
    the first partition is adjacent to the first chip area;
    the third partition is adjacent to the second chip area; and
    the second partition is positioned between the first partition and the third partition.

* * * * *